United States Patent
Nomura et al.

(10) Patent No.: US 6,388,186 B1
(45) Date of Patent: May 14, 2002

(54) THERMOPILE-TYPE THERMOELECTRIC SENSOR

(75) Inventors: Tadashi Nomura, Moriyama; Yukio Yoshino, Otsu, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/716,726

(22) Filed: Nov. 20, 2000

(30) Foreign Application Priority Data

Nov. 19, 1999 (JP) ............................................. 11-330397

(51) Int. Cl.[7] ............................................... H01L 35/28
(52) U.S. Cl. ........................................................ 136/224
(58) Field of Search ................................ 136/224, 225, 136/226

(56) References Cited

U.S. PATENT DOCUMENTS 5,229,612 A  7/1993  Pompei et al. .............. 250/349

FOREIGN PATENT DOCUMENTS

| GB | 1189660 | 4/1970 |
|----|---------|--------|
| JP | 58-139481 | 8/1983 |
| JP | 63-318174 | 12/1988 |
| JP | 10-19666 | 1/1998 |

*Primary Examiner*—Kathryn Gorgos
*Assistant Examiner*—Thomas H Parsons
(74) *Attorney, Agent, or Firm*—Ostrolenk, Faber, Gerb & Soffen

(57) ABSTRACT

It is made possible to adjust the output of a thermopile-type thermoelectric sensor in such a way that a thermoelectric pattern for sensitivity adjustment is connected in series to a plurality of thermoelectric patterns constituting a thermopile short-circuited patterns for short-circuiting cold junctions of the thermoelectric pattern for sensitivity adjustment are formed, and the short-circuited patterns are selectively cut off.

7 Claims, 6 Drawing Sheets

THERMOPILE-TYPE THERMOELECTRIC SENSOR

BACKGROUND OF THE INVENTION

1. Field of the Invention

The present invention relates to a thermopile-type thermoelectric sensor in which a plurality of patterns constituting thermocouples hereinafter, each of patterns is called a thermoelectric patterns are connected in series, the middle portion constitutes a light receiving portion hot junction portions of the thermoelectric patterns are disposed in the light receiving portion, and each of the thermoelectric patterns is radially disposed.

2. Description of the Related Art

In thermopile-type thermoelectric sensors, because many thermoelectric patterns are connected in series so as to obtain high sensitivity characteristics, it is required to reduce their output variations, and, therefore, up to now, various improvements have been carried out. For example, in a thermopile-type thermoelectric sensor shown in Japanese Unexamined Patent application Publication No. 10-19666, the thermal resistance of a thermoelectric pattern in the vicinity of the end of a membrane is set to be smaller than the thermal resistance near the not junction, and in this way, the temperature gradient of the thermoelectric pattern in the end portion of the membrane is reduced, and even if the dimension of the membrane is varied, the affect on output variations is made to be reduced.

However, in the above construction, output variations caused by dimensional variation of the membrane can be reduced, but there was a problem that the membrane was not effective against other variations such as dimensional variation of the thermoelectric pattern, dimensional variation and variation of the absorption factor of an infrared absorber to be disposed in the light receiving portion, etc.

SUMMARY OF THE INVENTION

Accordingly, it is an object of the present invention to provide a thermopile-type thermoelectric sensor for fulfilling adjustment functions of output variations, which is effective against all variations caused by the structure of the thermopile-type thermoelectric sensor.

A thermopile-type thermoelectric sensor according to the present invention is constructed so that the sensor may solve the above-mentioned problem as in the following.

(1) FIG. 1 is a top view when one example of a thermopile-type thermoelectric sensor according to the present invention is looked at from above. A pair of patterns (a thermoelectric pattern) is composed of a first pattern of thermoelectric material and a second pattern of thermoelectric material, and a thermoelectric pattern 1 is formed by connecting a plurality of these thermoelectric patterns in series. In the thermoelectric pattern is the thermoelectric patterns are radially arranged so that the hot junction of each thermoelectric pattern may be disposed in the middle portion of the sensor, a light receiving portion 2 is formed in this middle portion, and a thermoelectromotive force is generated in the thermoelectric pattern 1 by increasing the temperature of the light receiving portion 2 through an infrared absorber, etc., not shown in the drawing. In the present invention, a thermoelectric pattern 3 for sensitivity adjustment is connected to the thermoelectric pattern 1 in series. In this thermoelectric pattern 3 for sensitivity adjustment, short-circuited patterns for short-circuiting patterns are provided, and by cutting off these short-circuited patterns selectively by laser, etc., the output of the thermoelectric pattern 1 can be adjusted. The thermoelectric pattern 3 for sensitivity adjustment is formed at the same time when the thermoelectric pattern 1 is formed, and accordingly no burden increases in the manufacturing processes.

(2) In the present invention, instead of the short-circuited patterns provided in the thermoelectric pattern 3 for sensitivity adjustment, it is possible to lead out at least one lead-out pattern from patterns. By making the lead-out patterns short-circuited or open properly in a selective way, the output of the thermoelectric pattern 1 can be adjusted.

In a thermopile-type thermoelectric sensor according to the present invention, the above-mentioned first construction (1) or second construction (2) is mainly adopted, but in the first construction (1) the short-circuited patterns can be constructed in the following way.

Firstly, the short-circuited patterns can be constructed so as to short-circuit cold junctions themselves. Furthermore, a plurality of short-circuited patterns to be disposed between hot junctions and cold junctions can be formed. In the latter construction, fine adjustment of the output can be achieved.

Furthermore, in the above-mentioned first construction (1) and second construction (2), the polarity of thermoelectromotive forces in thermoelectric patterns for sensitivity adjustment can be decided as in the following way.

First, a thermoelectric pattern for sensitivity adjustment can be formed so as to generate a thermoelectromotive force of same polarity as a thermoelectric pattern. In this case, in the above-mentioned first construction (1), as the short-circuited patterns are cut off, the output of the thermoelectric sensor increased. Furthermore, in the second construction (2), as the lead-out patterns are short-circuited, the output of the thermoelectric sensor decreases.

Moreover, the thermoelectric pattern for sensitivity adjustment can be formed so as to generate a thermoelectromotive force of opposite polarity to the thermoelectric pattern. In this case, in the above-mentioned first construction (1) as the short-circuited patterns are not off, the output of the thermoelectric pattern decreases. Furthermore, in the above-mentioned second construction (2), as the lead-out patterns are short-circuited, the output of the thermoelectric pattern increases.

Furthermore, a combination of a thermoelectric pattern for sensitivity adjustment formed so as to generate a thermoelectromotive force of opposite polarity to the thermoelectric pattern can be also constructed.

DESCRIPTION OF THE PREFERRED EMBODIMENTS

Figure 2:
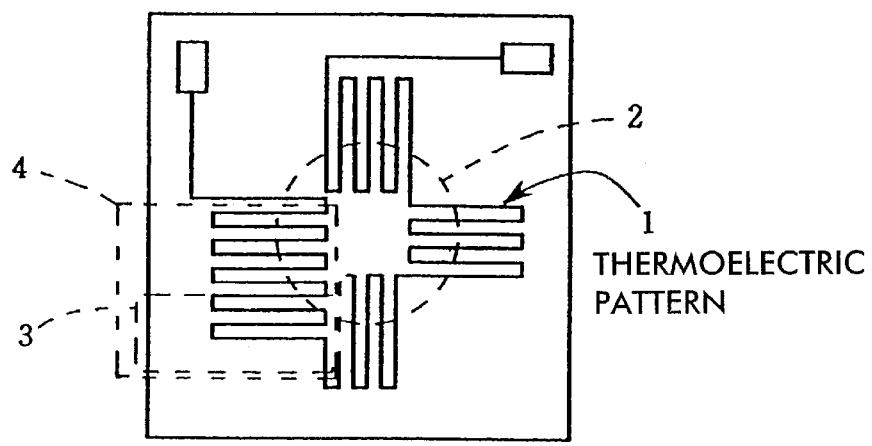
FIG. 2 shows the construction of a thermopile-type thermoelectric sensor as an embodiment of the present invention.
Figure 3A:
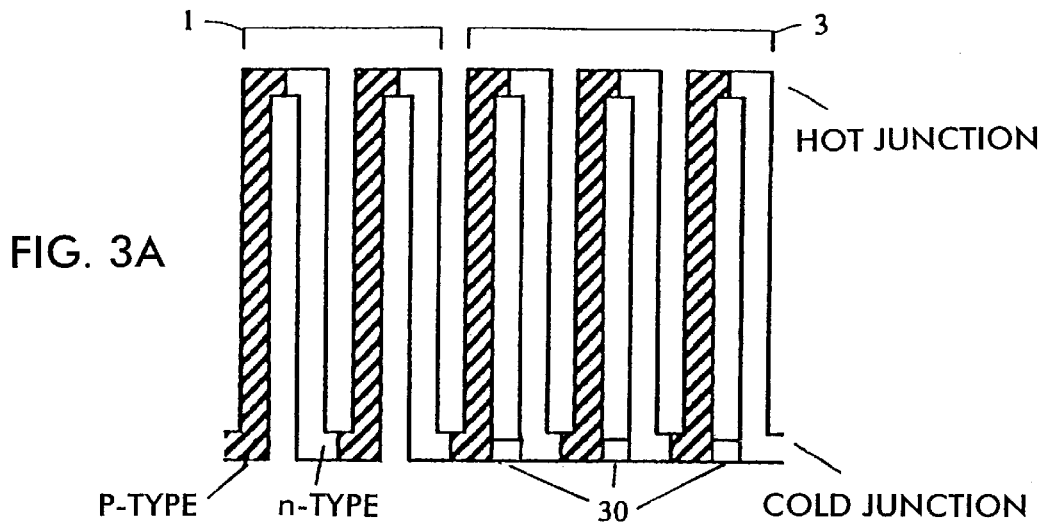
FIGS. 3A, 3B, and 3C show a first embodiment of the present invention.
Figure 3B:
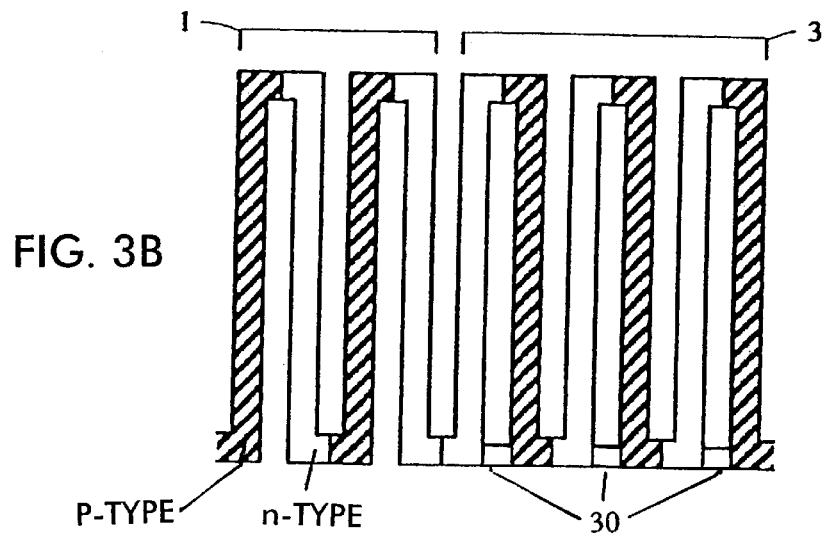
Figure 3C:
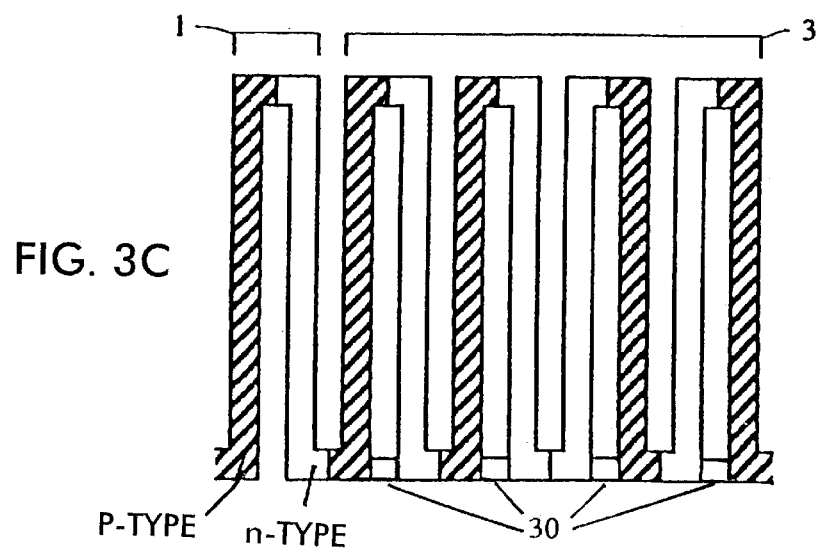

FIG. 2 is a top view when a thermopile-type thermoelectric sensor of an embodiment of the present invention is looked at from above, and FIGS. 3A, 3D, and 3C show examples of the essential part of the thermoelectric sensor.

Figure 1:
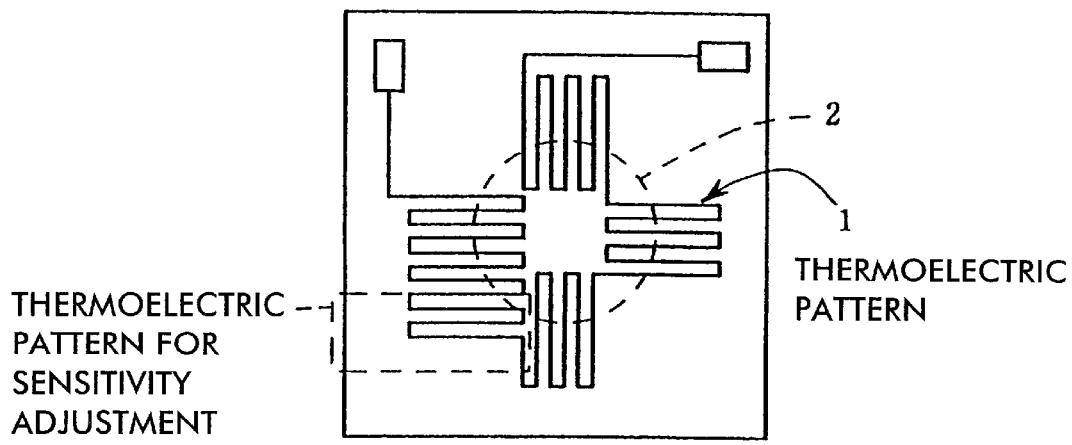
FIG. 1 shows the construction of a thermopile-type thermoelectric sensor according to the present invention.

In the construction of the thermopile-type thermoelectric sensor, in the same way as a conventional sensor shown in FIG. 1, a pair of a first thermoelectric material (p-type) to generate a positive thermoelectromotive force and a second thermoelectric material (n-type) to generate a negative thermoelectromotive force which are linearly arranged in parallel constitutes a thermoelectric pattern, a plurality of thermoelectric patterns are connected in series, the hot junction of each of the plurality of thermoelectric patterns is disposed in a light receiving portion 2, and each of the plurality of thermoelectric patterns is radially arranged. A thermoelectric pattern 3 for sensitivity adjustment which has a plurality of short-circuited patterns is connected to the thermoelectric pattern 1 in the thermopile-type thermoelectric sensor of the present embodiment. When the thermoelectric pattern 3 for sensitivity adjustment is formed, all the short-circuited patterns are formed and they are cut off by laser, etc., as required in the process of sensitivity adjustment.

FIGS. 3A, 3B, and 3C show the area 4 shown in FIG. 2, and FIG. 3A shows a first example of the above-mentioned embodiment. In this example, part of a thermoelectric pattern 1 is composed of two patterns and a thermoelectric pattern 3 for sensitivity adjustment is composed of three patterns. In each pattern, a first thermoelectric material of p-type and a second thermoelectric material of n-type are used as materials for a thermocouple, these are arranged in parallel, hot junctions are formed in the upper part, and cold junctions are formed in the lower part. In the thermoelectric pattern 3 for sensitivity adjustment, short-circuited patterns 30 for short-circuiting the patterns are provided in the cold junction portions, the cold junctions are short-circuited by these short-circuited patterns 30. When patterns are formed, the short-circuited patterns 30 are formed in all the thermoelectric patterns of the thermoelectric pattern 3 for sensitivity adjustment as shown in the drawing, and when the output of the thermoelectric sensor is adjusted, these short-circuited patterns are cut off by laser, etc., as required. In this example, because the p-n configuration of the thermoelectric pattern 3 for sensitivity adjustment is the same as that of the thermoelectric pattern 1, the polarity of the thermoelectromotive force of the thermoelectric pattern 3 for sinsitivity adjustment becomes the same as that of the thermoelectromotive force of the thermoelectric pattern 1. Therefore, when one of the short-circuited patterns 30 is cut off, the output of the thermoelectric sensor increases, and when two of them are cut off, the output more increases.

That is, in the example shown in FIG. 3A, right after the patterns have been formed, because all the thermoelectric patterns of the thermoelectric pattern 3 for sensitivity adjustment are short-circuited by the short-circuited patterns 30, the thermoelectromotive force generated in the thermoelectric pattern 3 for sensitivity adjustment does not contribute to the output of the thermopile, but by cutting off the short-circuited patterns 30 the thermoelectromotive force generated in the thermoelectric patterns thereof is added to the output of the thermopile and accordingly adjustment for increasing the output of the thermopile can be accomplished. Then, the more the number of short-circuited patterns to be cut off increases, the more the output of the thermopile increases.

FIG. 3D shows a second example. In this example, the configuration of p-n polarity of the thermoelectric pattern 3 for sensitivity adjustment is opposite to the configuration or p-n polarity of the thermoelectric pattern 1. Accordingly, the polarity of the thermoelectromotive force of the thermoelectric pattern 3 for sensitivity adjustment is opposite to that of the thermoelectric pattern 1. Because of this, contrary to the example shown in FIG. 3A, the more the short-circuited patterns 30 are cut off, the more the output of the thermopile decreases.

Figure 7:
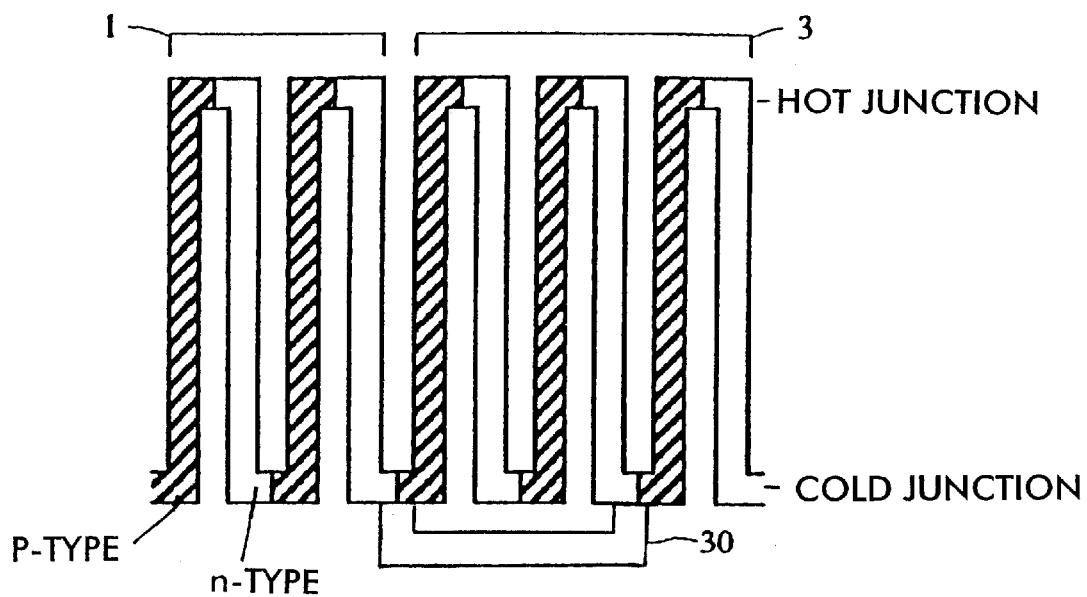
FIG. 7 shows a modification of the first embodiment of the present invention.

FIG. 3C shows a third example. In this example, the thermoelectric pattern 3 for sensitivity adjustment is composed of a combination of patterns generating a thermoelectromotive force having the same polarity as the thermoelectric pattern 1 and patterns generating a thermoelectromotive force having opposite polarity to the thermoelectric pattern 1. Accordingly, the thermopile can be adjusted so as to increase or decrease its output to a required extent, which is dependent on short-circuited patterns to be cut off. In FIGS. 3A, 3B, and 3C, neighboring patterns are short-circuited, out as shown in FIG. 7, alternate patterns may be short-circuited, or patterns may be short-circuited at intervals of a plurality of patterns.

Figure 4A:
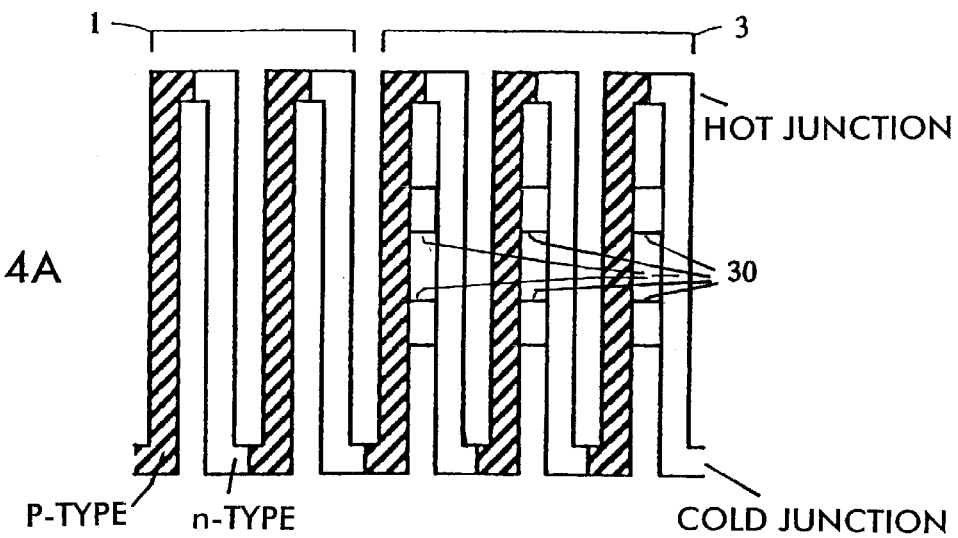
FIGS. 4A, 4B, and 4C show a second embodiment of the present invention.
Figure 4B:
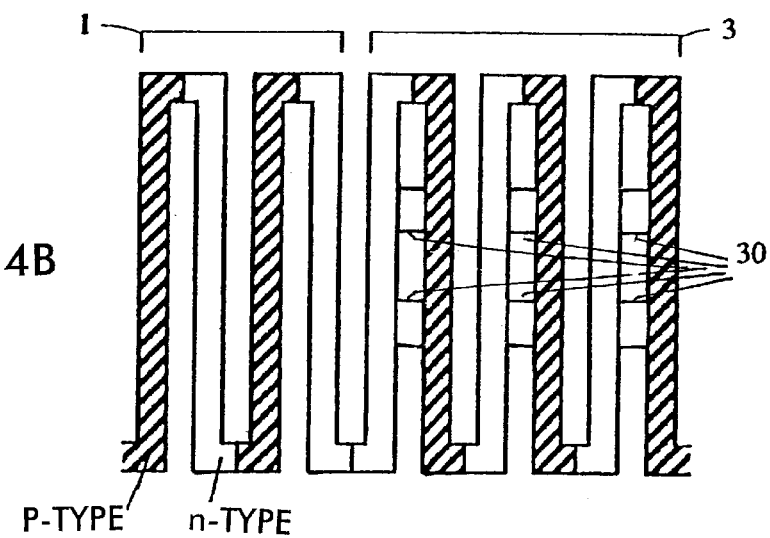
Figure 4C:
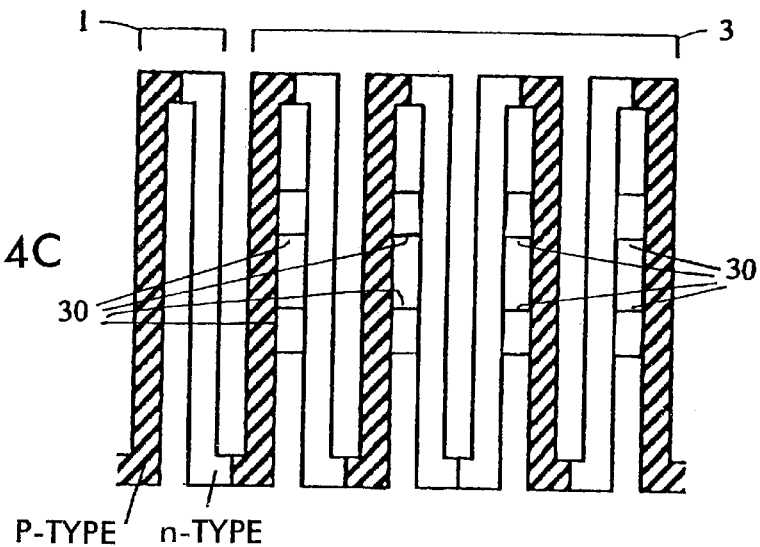

FIGS. 4A, 4B, and 4C show another embodiment of the present invention. In this embodiment, short-circuited patterns are not provided in cold junction portions, but a plurality of short-circuited patterns disposed between hot junctions and cold junctions are formed. In examples shown in FIGS. 4A, 4B, and 4C, two short-circuited patterns are formed in each pair of the thermoelectric pattern 3 for sensitivity adjustment. When the output of the thermopile is adjusted, the plurality of short-circuited patterns in each pair are cut off in order, starting with the short circuited pattern which is the closest to the cold junction. In the thermopile-type thermoelectric sensor of the present embodiment, assuming all the short-circuited patterns formed in the thermoelectric pattern 3 for sensitivity adjustment are not cut off, the short-circuited patterns which are arranged closest to the cold junctions function as a hot junction, and when these short-circuited patterns are cut off, the next short circuited patterns on the hot junction sides function as a hot junction. Here, an important thing is the order of cutting off the short-circuited patterns, and it is required to cut off from the short-circuited patterns which are arranged closest to the cold junctions and then to cut off in order the short-circuited patterns which are closer to the not junctions. In this way, when the short-circuited patterns closer to the hot junctions are cut off in order, finer adjustment is achieved than the adjustment method as in the examples shown in FIGS. 3A, 3B, and 3C.

FIG. 4A shows a first example, and in this example, the configuration of p-n polarity of a thermoelectric pattern 3 for sensitivity adjustment is set to be the same as the configuration of p-n polarity of a thermoelectric pattern 1. Therefore, both the thermoelectric patterns 1 and 3 have the same polarity of thermoelectromotive forces. Because of this, the more the short-circuited patterns 30 are cut off, the more the output of the thermopile increases.

FIG. 4B shows a second example, and in this example, the configuration of p-n polarity of a thermoelectric pattern 1. Therefore, the more the short-circuited patterns 30 are cut off, the more the output of the thermopile decreases.

FIG. 4C shows a third example, and in this example, a thermoelectric pattern 3 for sensitivity adjustment is composed of a combination of patterns to generate a thermoelectromotive force having the same polarity as that of a thermoelectric pattern 1 and patterns to generate a thermoelectromotive force having the opposite polarity to that or a thermoelectric pattern 1. Therefore, in this example, the thermopile can be adjusted so as to increase or decrease the output, depending on which one of the patterns 30 are cut off and on now many the patterns 30 are cut off.

Figure 5A:
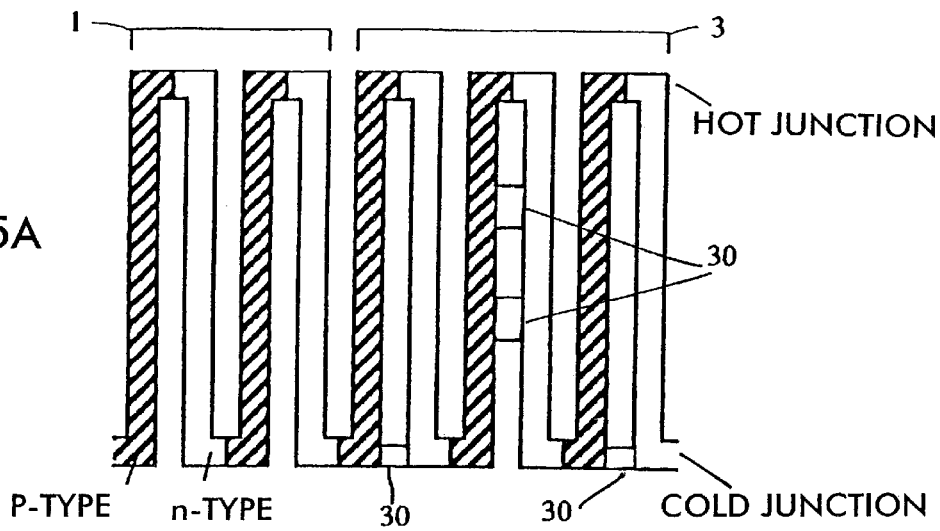
FIGS. 5A, 5B, and 5C show a third embodiment of the present invention.
Figure 5B:
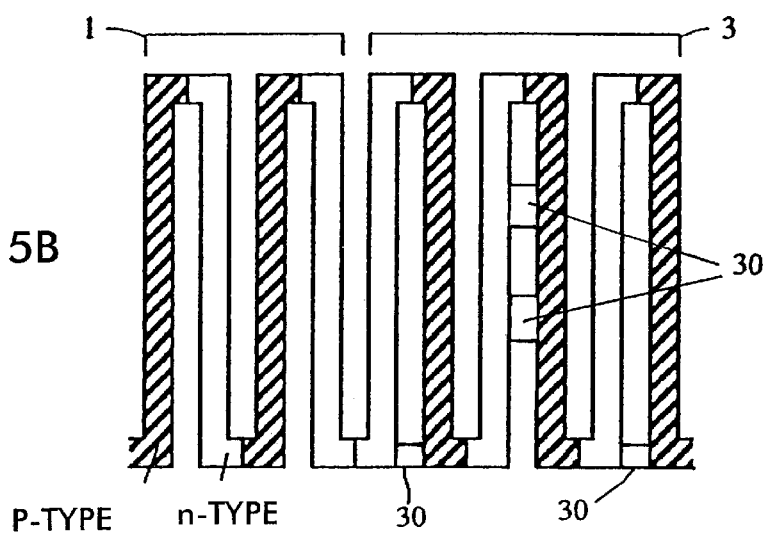
Figure 5C:
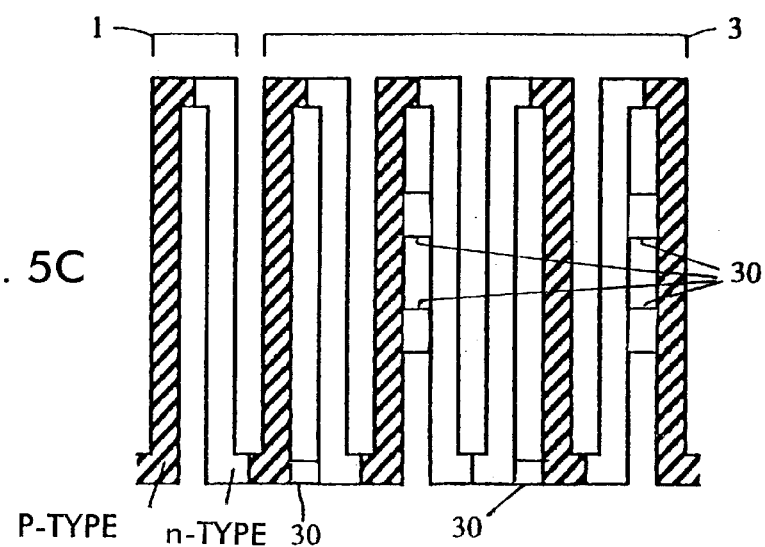

FIGS. 5A, 5B, and 5C show further another embodiments. In this embodiment, short-circuited patterns are also used in the same way as in FIGS. 3A, 3B, 3C, 4A, 4B, and 4C, but some short-circuited patterns 30 are formed in cold junctions and further a plurality of short-circuited patterns 30 are formed in the middle of patterns. FIGS. 5A to 5C show each of examples of the present embodiment. In FIG. 5A, the configuration of p-n polarity of a thermoelectric pattern 3 for sensitivity adjustment is set to be the same as that of a thermoelectric pattern 1, and accordingly the polarity of a thermoelectromotive force of the thermoelectric pattern 3 for sensitivity adjustment ha the same sign as the polarity of a thermoelectromotive force of the thermoelectric pattern 1. In the example in FIG. 5B, the configuration or p-n polarity of the thermoelectric pattern 3 for sensitivity adjustment is set to be opposite to the configuration of p-n polarity of the thermoelectric pattern 1, and accordingly the polarity or a thermoelectromotive force of the thermoelectric pattern 3 for sensitivity adjustment is opposite to the polarity of a thermoelectromotive force of the thermoelectric pattern 1. In the example in FIG. 5C, the thermoelectric pattern 3 for sensitivity adjustment is composed of a combination of patterns having the same polarity as that of the thermoelectric pattern 1 and patterns 30, the short-circuited patterns connecting cold junctions are cut off when coarse adjustment the output of the thermopile is made, and the short-circuited patterns 30 in the middle of patterns, that is, the plurality of short-circuited patterns formed between the hot junctions and cold junctions are cut off when fine adjustment of the output of the thermopile is made. In this embodiment, there is an advantage that both coarse adjustment and fine adjustment can be made.

Figure 6A:
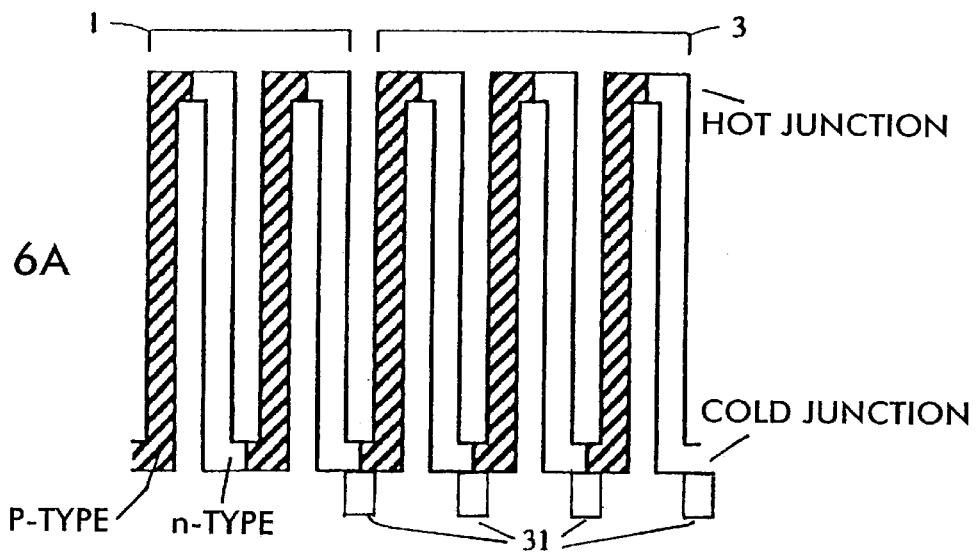
FIGS. 6A, 6B, and 6C show a fourth embodiment of the present invention.
Figure 6B:
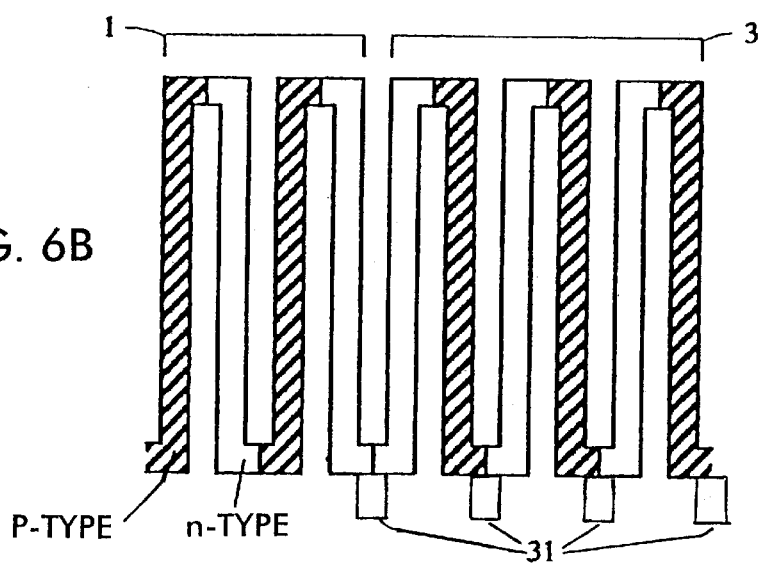
Figure 6C:
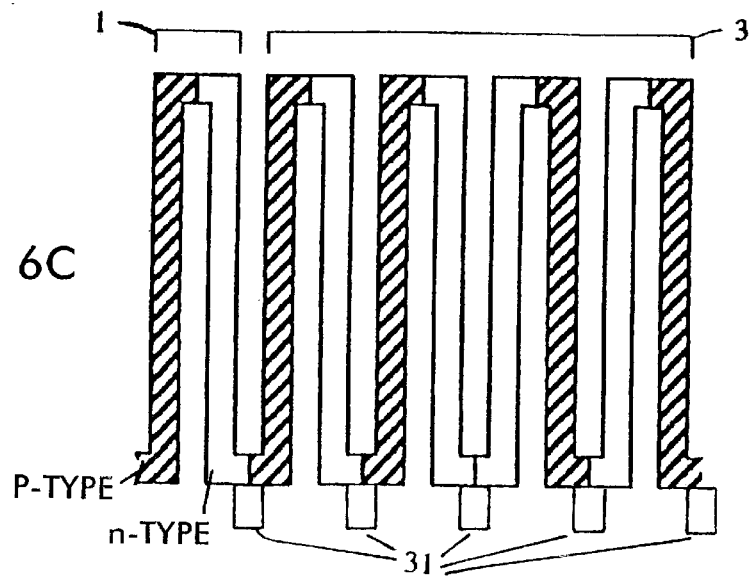

FIGS. 6A, 6B, and 6C show further another embodiment. In this embodiment, lead-out patterns 31 are used without making use of short-circuited patterns. That is, the lead-out patterns 31 are lead out of a thermoelectric pattern 3 for sensitivity adjustment, and by two of the lead-out patterns 31 selectively short-circuited, the output of the thermopile is adjusted. FIGS. 6A to 6C show each of the examples. In a first example in FIG. 6A, the lead-out patterns 31 are lead out downward from the cold junction portions of the thermoelectric pattern 3 for sensitivity adjustment. When patterns are formed, these lead-out patterns 31 are formed at the same time, and right after the lead-out patterns 31 have been formed, they are made open. Then, when the output of the thermopile as adjusted, the lead-out patterns 31 are selectively short-circuited. For example, in the first example shown in FIG. 6A, by short circuiting the two lead-out patterns from left out of four, one pair of thermoelectric patterns in the thermoelectric pattern 3 for sensitivity adjustment are short-circuited. Furthermore, by short-circuiting the three lead-out patterns from left, two pairs or patterns in the thermoelectric pattern 3 for sensitivity pattern are short-circuited. In this way, by selectively the short-circuiting lead-out patterns 31, the output of the thermopile can be adjusted. Moreover, in the first example in FIG. 6A, the polarity of a thermoelectromotive force of the thermoelectric pattern 3 for sensitivity adjustment is the same as that of the thermoelectric pattern 1. In the second example in FIG. 6B, the polarity of an thermoelectromotive force of the thermoelectric pattern 3 for sensitivity adjustment is opposite to that of the thermoelectric pattern 1. In the third example in FIG. 6C, the thermoelectric pattern 3 for sensitivity adjustment is composed or a combination of patterns generating a thermoelectromotive force of the same polarity as that of a thermoelectromotive force of the thermoelectric pattern 1 and patterns generating a thermoelectromotive force of opposite polarity to that of a thermoelectromotive force of the thermoelectric pattern (1).

Therefore, in the first example in FIG. 6A, the more the number of short-circuited lead-out patterns 31 increases, the more the output of the thermopile decreases. In the second example in FIG. 6B, the more the number of short-circuited lead-out patterns 31 increases, the more the output of the thermopile increases. In the third example shown in FIG. 6C, the output of the thermopile can be adjusted so as to increase or decrease by choosing the number and the locations of lead-out patterns 31 to be short-circuited.

Moreover, in each of the above embodiments, all the patterns of the thermoelectric pattern 3 for sensitivity adjustment are made so as to be short-circuited, but only limited patterns of these may be made so as to be short-circuited.

According to the present invention, because the output of the thermopile is made so as to be adjusted by choosing the number and location of short-circuited patterns to be cut off or the number and location of lead-out patterns to be short-circuited, variations of all types including dimensional variation of thermoelectric patterns, dimensional variation of infrared absorbers, variation of absorption coefficients, etc., can be effectively dealt with, and accordingly a thermopile-type thermoelectric sensor which has small output variations and is very accurate can be realized.

While the invention has been particularly shown and described with reference to preferred embodiments, it will be understood by those skilled in the art that the foregoing and other changes in form and details can be made without departing from the spirit and scope of the invention.

What is claimed is:

1. A thermopile thermoelectric sensor comprising:
   a plurality of thermoelectric patterns constituting a thermopile; and
   a thermoelectric pattern for sensitivity adjustment having at least one short-circuited pattern for short-circuiting between patterns, the thermoelectric pattern for sensitivity adjustment connected in series to the plurality of thermoelectric patterns.

2. A thermopile thermoelectric sensor as set forth in claim 1, wherein the short-circuited patterns in the thermoelectric pattern for sensitivity adjustment short-circuit cold junctions of the thermoelectric pattern for sensitivity adjustment.

3. A thermopile thermoelectric sensor as set forth in claim 1, wherein a plurality of short-circuited patterns are formed so as to be disposed between not junctions and cold junctions in the thermoelectric pattern for sensitivity adjustment.

4. A thermopile thermoelectric sensor as set forth in claim 1, wherein the thermoelectric pattern for sensitivity adjustment is formed so as to generate a thermoelectromotive force of same polarity as the thermoelectric pattern.

5. A thermopile thermoelectric sensor as set forth in claim 1, wherein the thermoelectric pattern for sensitivity adjustment is formed so as to generate a thermoelectromotive force of opposite polarity to the thermoelectric pattern.

6. A thermopile thermoelectric sensor as set forth in claim 1, wherein the thermoelectric pattern for sensitivity adjustment comprises a combination of a thermoelectric pattern for sensitivity adjustment formed so as to generate a thermoelectromotive force of same polarity as the thermoelectric pattern and a thermoelectric pattern for sensitivity adjustment formed so as to generate a thermoelectromotive force of opposite polarity to the thermoelectric pattern.

7. A thermopile thermoelectric sensor comprising:
   a plurality of thermoelectric patterns constituting a thermopile; and
   a thermoelectric pattern for sensitivity adjustment having at leas one lead-out pattern for leading out of patterns, the thermoelectric pattern for sensitivity adjustment connected in series to the plurality of thermoelectric patterns.

* * * * *